United States Patent [19]

Powers et al.

[11] Patent Number: 5,701,170
[45] Date of Patent: Dec. 23, 1997

[54] SYSTEM FOR AUTOMATICALLY EXPOSING AND LABELING A PLURALITY OF LITHOGRAPHIC PLATES

[75] Inventors: John Powers; Terry Shelton; Michael Gonseth, all of Springfield, Mo.

[73] Assignee: Western Litho Plate & Supply Co., St. Louis, Mo.

[21] Appl. No.: 686,653

[22] Filed: Jul. 26, 1996

Related U.S. Application Data

[60] Provisional application No. 60/001,575 Jul. 27, 1995.
[51] Int. Cl.[6] .................... G03B 27/30; G03B 27/04; B07C 5/00
[52] U.S. Cl. .................... 355/40; 355/85; 355/112; 101/463.1; 101/465; 101/484
[58] Field of Search .................... 355/85, 112, 40, 355/41, 42, 43; 101/463.1, 465, 484

[56] References Cited

U.S. PATENT DOCUMENTS

| | | | |
|---|---|---|---|
| 4,178,097 | 12/1979 | Sara | 355/100 O |
| 4,423,955 | 1/1984 | Powers | 355/99 |
| 4,573,190 | 2/1986 | Tsunoda et al. | 382/1 |
| 5,072,253 | 12/1991 | Patton | 355/40 O |
| 5,077,573 | 12/1991 | Murayama et al. | 355/40 O |
| 5,181,162 | 1/1993 | Smith et al. | 364/419 |
| 5,193,690 | 3/1993 | Powers et al. | 209/558 |
| 5,213,043 | 5/1993 | Reimers et al. | 101/463.1 |
| 5,281,993 | 1/1994 | Crochetierre et al. | 355/40 O |
| 5,369,468 | 11/1994 | Powers et al. | 355/99 |
| 5,604,579 | 2/1997 | Kushida | 355/40 X |

*Primary Examiner*—R. L. Moses
*Assistant Examiner*—Shival Virmani
*Attorney, Agent, or Firm*—Senniger, Powers, Leavitt & Roedel

[57] ABSTRACT

A system for generating from unimaged plates a plurality of exposed lithographic plates to be provided to a press for use in printing. The system is for use with a film exposer for exposing a negative which includes an identifying code identifying the negative. An exposing station has a first reader for reading the identifying code and has an exposer for exposing a number of unimaged plates to generate an image thereon from the exposed negative. The number of exposed plates corresponds to the identifying code read by the reader. A bending station has a second reader for reading the identifying code on the exposed plates and has an optical punch bender for bending the exposed plates in accordance with information corresponding to the identifying code. An inspection station has a third reader for reading the identifying code on the bent plates and has an inspection unit for inspecting the bent plates to determine whether a particular bent plate has parameters which correspond to parameters defined by the identifying code of the particular bent plate whereby inspected plates which pass inspection and have labels thereon are provided to the press for use in printing.

19 Claims, 6 Drawing Sheets

EXPOSING STATION 102

Negative(s) 106 are transported to plate/negative exposing chamber

↓

Exposing frame lowers to plate/negative exposure platen

↓

Bar-code reader(s) 112 scan negative(s) 106

↓

Bar-code information is transmitted to controller 118 via I/O buffer 121

↓

Bar-code information is correlated to the imposition file 120 to determine number of plates to be produced

↓

If no data is found, a no-data code is transmitted to the exposer PLC 122 and the exposing station 102 alerts the operator to input a value manually or a default value can be preset

↓

If the bar-code data is found, the value(s) is transmitted from the controller 118 to exposer PLC 122 and the values are stored in counter 124

↓

The controller 118 may be updated as the plate(s) are completed

FIG. 5A

OPTICAL PUNCH BENDER 126

An exposed, developed plate 116 is transported to the optical punch bender 126 via conveyor belts Plate 116 is pre-registered in the bend station on register pins or with edge stops Bar-code reader 132 scans a pre-defined area for a bar-code image 110

If a bar-code 110 is located, its data is transmitted to the controller 118 via a bar-code controller and I/O buffer 128

Bar-code information is correlated to the imposition file 120 to determine press compensation data and press location data The compensation data is transmitted to the OPB PC 134 and the press location data is transmitted to the ink jet printer 136

The compensation data is used to adjust the press register notch location on the plate 116 when the OPB punches the plate 116

If no compensation data is found, there is no adjustment made to the press notch location The plate 116 is bent to the correct press geometry The ink jet printer 136 prints the press location data on the back of the plate 116 as it exits the OPB 126

FIG. 5B

AUTOMATIC INSPECTION STATION 138

An exposed, developed, labeled, bent plate 128 is transported to the automatic inspection station 138, via conveyor belts

↓

Plate 128 is registered on pins and mandrels that match the press geometry

↓

Bar-code reader 139 scans a pre-defined area for a bar-code image 110

↓

If a bar-code 110 is located, its data is transmitted to the controller 118 via a bar-code controller and an I/O buffer

↓

Bar-code information is correlated to imposition files 120 to determine press compensation data

↓

The compensation data is transmitted to the AIS PC and the plate image is inspected for accurate location based on pre-defined acceptable tolerances

↓

If the plate 128 is deemed accurate, the plate is transported to an accumulation bin for plates in tolerance

↓

If the plate 128 is deemed out of tolerance, the plate is transported to an accumulation bin for plates out of tolerance

↓

The controller 118 may be updated with plate inspection results

SYSTEM FOR AUTOMATICALLY EXPOSING AND LABELING A PLURALITY OF LITHOGRAPHIC PLATES

This application claims the benefit of U.S. Provisional Application No. 60/001,575, filed Jul. 27, 1995.

BACKGROUND OF THE INVENTION

Field of the Invention

The invention generally relates to a system for manufacturing lithographic plates and, in particular, a system for generating from unimaged plates a plurality of exposed, bent and labeled lithographic plates to be provided to a press for use in printing.

Apparatus for exposing or bending lithographic plates are well-known in the prior art. In general, such apparatus are stand-alone stations and are manually operated. There is a need for a system having a film printer, exposer station, optical punch bender, and automatic inspection station, which are all interconnected by a controller for synchronous automatic operation. Furthermore, there is a need for such a system in which the bent lithographic plates are labeled so that plates provided to the printing press can be identified by the printing press operator. Furthermore, there is a need for such a system in which negatives used to expose the plates carry a code which identifies it and allows tracking and control of the number of plates made from the negative.

SUMMARY OF THE INVENTION

It is an object of this invention to provide a lithographic plate system which automatically exposes, bends, and inspects the particular number of plates needed from each particular negative.

It is another object of this invention to provide a lithographic plate system which reads a code on the negative or on the plates to control the number of plates to be printed and to control the bending characteristics of the plates.

It is another object of this invention to provide a lithographic plate system which labels plates according to information stored in the system and according to the code on the negative or on the plates.

It is another object of this invention to provide a lithographic plate system which includes software for automatically keeping track of system and component operation, wear and tear and which notifies an operator when maintenance is required.

In one form the invention comprises a system for generating from unimaged plates a plurality of exposed lithographic plates to be provided to a press for use in printing. The system is for use with a film exposer for exposing a negative which includes an identifying code identifying the negative. An exposing station has a first reader for reading the identifying code and has an exposer for exposing a number of unimaged plates to generate an image thereon from the exposed negative. The number of exposed plates corresponds to the identifying code read by the reader. A bending station has a second reader for reading the identifying code on the exposed plates, and has an optical punch bender for bending the exposed plates in accordance with information corresponding to the identifying code. An inspection station has a third reader for reading the identifying code on the bent plates and has an inspection unit for inspecting the bent plates to determine whether a particular bent plate has parameters which correspond to parameters defined by the identifying code of the particular bent plate. Inspected plates which pass inspection and which have labels thereon are provided to the press for use in printing.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION OF THE PREFERRED EMBODIMENTS

Figure 1:
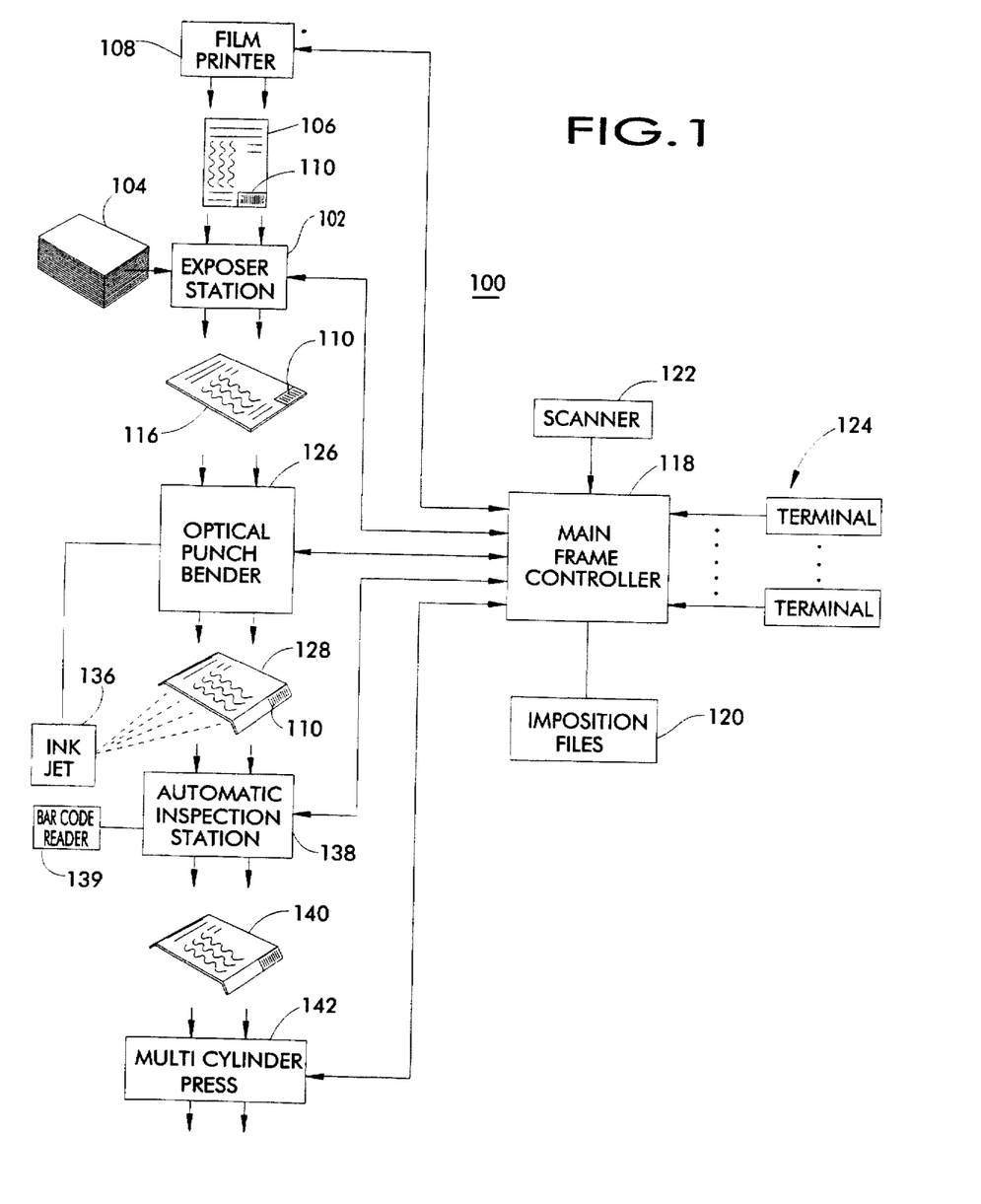
FIG. 1 is a block diagram illustrating one preferred embodiment of a system according to the invention for automatically exposing, bending, labeling, and inspecting a plurality of lithographic plates to be made from a film negative.

FIG. 1 is a block diagram illustrating one preferred embodiment of the system 100 according to the invention for automatically exposing, bending and labeling a plurality of lithographic plates. The system 100 includes an exposure station 102 which is provided with a supply of unimaged plates 104. Such an exposer station is described in co-assigned U.S. Pat. Nos. 4,423,955 and 5,369,468, the entire disclosures of which are incorporated herein by reference. The exposing station 102 also receives an exposed negative 106 from a film printer 108 for exposing the negative. The negative 106 includes an identifying code such as bar code 110 which is unique to the particular negative and identifies the negative in the context of the system.

Figure 2:
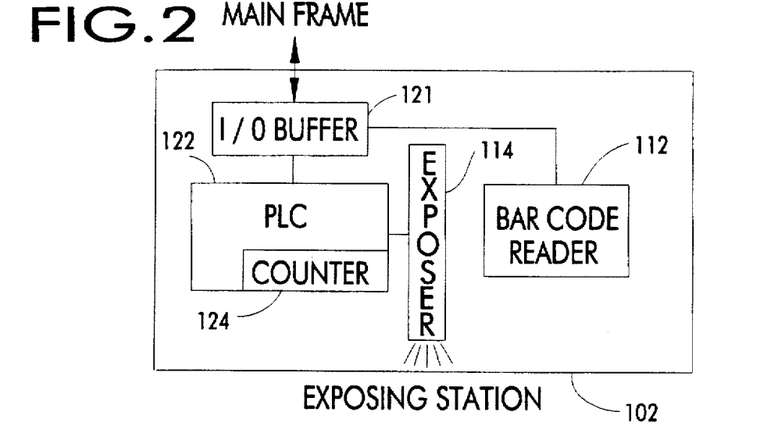
FIG. 2 is a block diagram of one preferred embodiment of the exposer station of the system illustrated in FIG. 1.

As shown in FIG. 2, the exposing station includes a first bar code reader 112 for reading the identifying code 110 on negative 106. Exposing station 102 also has an exposer 114 for generating light through the exposed negative 106 for exposing a number of unimaged plates 104 to generate an image on each plate.

The exposing station 102 generates a particular number of exposed lithographic plates 116, the particular number equal to the number of plates which will be needed for printing by a press 142. Exposer station is provided with the particular number by communicating with a main frame controller 118. Controller 118 has access to imposition files 120, a scanner 122 (for scanning information to be stored in memory) and operator interface terminals 124 which provide information to the controller regarding the number of plates needed from each negative in order to complete a printing project. The imposition file 120 defines the press letter designation (A, B, C1, etc.), press unit, couple, lateral position of plate, circumferential position of plate, plate number and X and Y coordinates. This information is provided to the exposing station 102 via an I/O buffer 121 connected to the controller 118 so that a programmable logic controller (PLC) 122 can control the operation of the exposing station 102. The PLC 122 includes a counter 124, such as an optical counter, a mechanical counter or an electronic cycle counter, which counts the number of plates being exposed by the exposing station 102. When the counted number of plates exposed is equal to the number of plates stored in the imposition files 120 or otherwise indicated by the controller 118, the exposing station 102 accepts the next exposed negative 104 to begin printing plates from the next negative.

Each exposed lithographic plate 116 is provided to an optical punch bender (OPB) 126 for forming the plate into a particular shape so that it can be mounted on the printing press 142. Such a bender is described in co-assigned application Ser. No. 08/076,411, now U.S. Pat. No. 5,454,247, the entire disclosure of which is incorporated herein by reference. In particular, optical punch bender 126 communicates with the main frame controller 118 to determine the specifications and other parameters to which the plate should be bent. For example, the controller 118 would be aware of particular idiosyncracies of each press and the specifications of the position of each press so that the controller 118 would instruct the bender 126 to bend a particular plate in a particular way so that it can be mounted at a specific press location.

Figure 3:
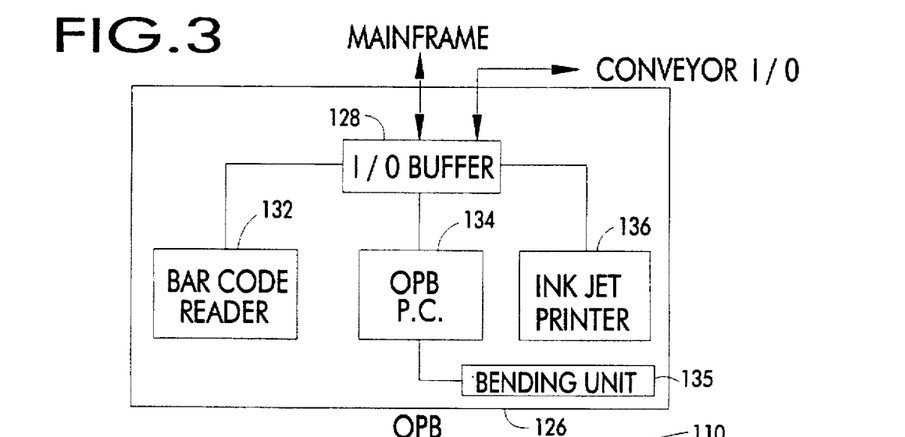
FIG. 3 is a block diagram of one preferred embodiment of the optical punch bender (OPB) of the system illustrated in FIG. 1.

As shown in FIG. 3, the optical punch bender 126 includes an I/O buffer 130 for communicating with the controller 118. The bender 126 also includes a second bar code reader 132 for reading the bar code printed on the exposed lithographic plate 116. Reader 132 allows the bender 126 to identify the particular plate which is being bent.

Figure 4:
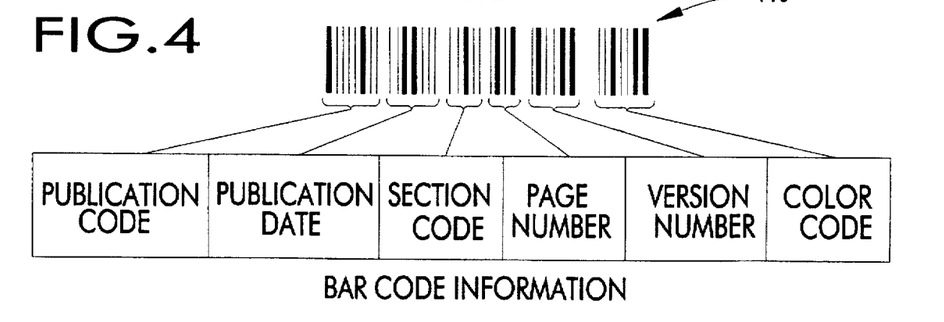
FIG. 4 is a schematic illustration of one preferred embodiment of a bar code and its corresponding information which may be part of the film negative and which corresponding bar code is printed on the exposed lithographic plates to identify the plate.

A personal computer 134 controls the operation of the optical punch bender 126 including bending unit 135 and communicates with the controller 118 via the I/O buffer 130. After the bar code reader 132 reads the bar code 110 on the exposed lithographic plate 116, this information is provided to the main frame controller 118 by the bar code reader 132 via buffer 130. The personal computer 134 of the optical punch bender 126 accesses this information in the controller 118 via the buffer 130 and instructs an ink jet printer 136 via buffer 130 to print information corresponding to the bar code on the underside of the bent plate 128. In particular, the bar code specifies information such as illustrated in FIG. 4 including several bar codes indicating a publication code, several bar codes indicating a publication date, and the remaining bar codes indicating such things as a section code, a page number, a version number, and/or a color code. This information would be printed on the back of the plate 128 by the ink jet printer 136 in human readable alphanumeric form so that an operator who was mounting the plate on a printing press could verify the identification of the plate. In addition, other information could be printed on the back of the plate, such information either resident in the PC 134 and cross-referenced to the bar code or such information resident in the controller 118 and cross-referenced to the bar code and available via the buffer 130. For example, the imposition file information may be printed on the back of the plate as follows: two character-numeric indicating the press, two digits numeric indicating the unit identification, single digital numeric indicating the cylinder number, single digit alphabetic indicating the zone identification, and single digit alphabetic including front or back location.

Next, the bent plate 128 including the bar code 110 on the lithographic printed face thereof and including the information which has been printed on the back by the ink jet printer 136 proceeds to an automatic inspection station (AIS) 138. Such an inspection station is described in co-assigned U.S. Pat. No. 5,193,690, the entire disclosure of which is incorporated herein by reference. A bar code reader 139 scans a pre-defined area for a bar code image and inspects the plate 128 based on the information corresponding to the image. After the inspection is complete, the inspected plate 140 is then provided either to a storage area (not shown) which can be accessed at a later time by an operator or the inspected plate 140 may be provided directly to a multi-cylinder press 142 and either automatically mounted or manually mounted on the press for printing.

This system 100 may also include a folio reader as described in co-assigned U.S. patent application Ser. No. 08/196,955 (WLP 7744), the entire disclosure of which is incorporated herein by reference.

Figure 5A:
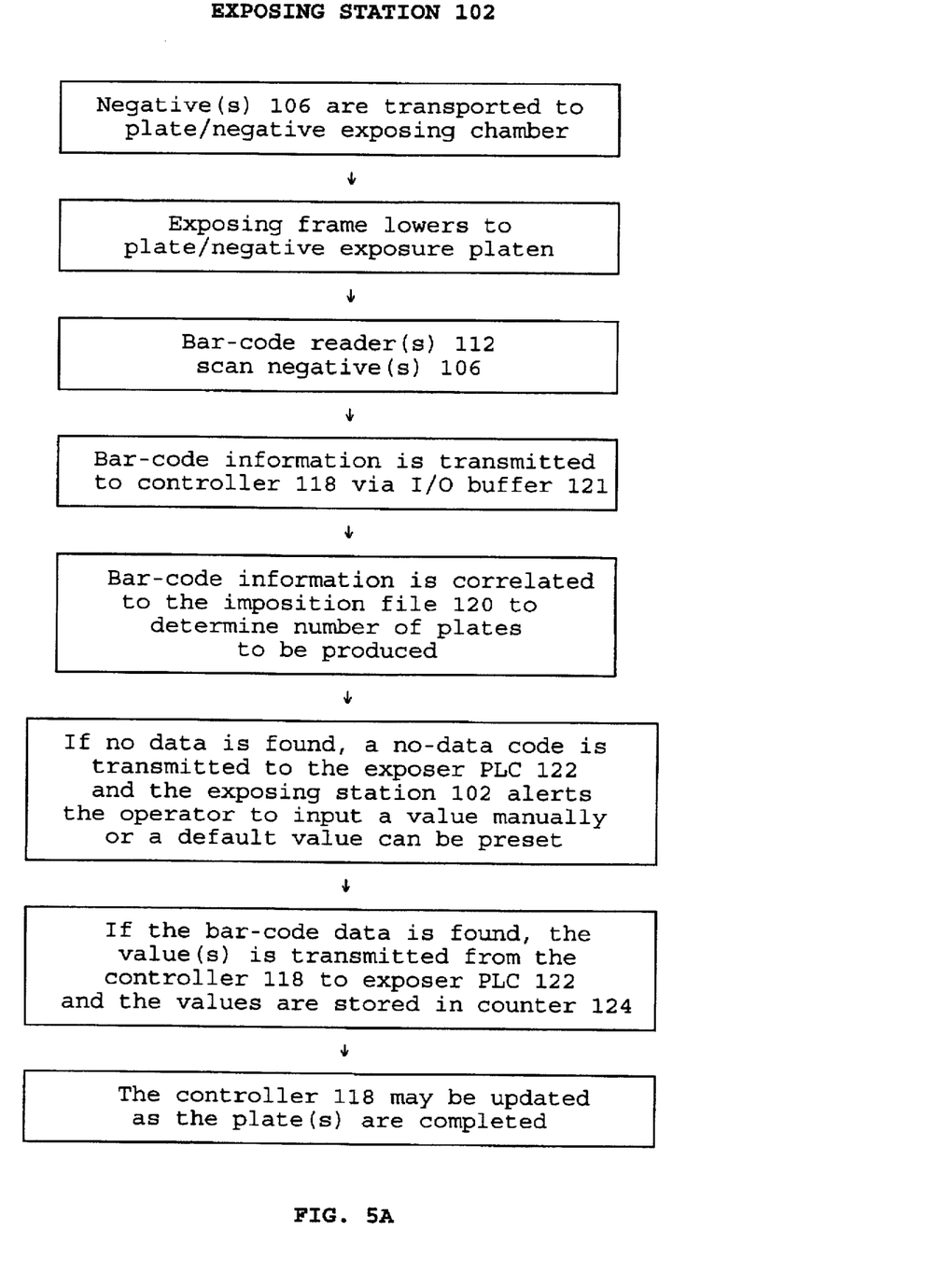
FIGS. 5A, 5B and 5C are flow charts illustrating the steps employed by the exposer station, optical punch bender (OPB) and automatic inspection station (AIS), respectively, in the operation of the system of the invention, which steps may be implemented by software in one preferred embodiment of the invention.

FIG. 5A illustrates the steps of the exposing station 102. Initially, exposed negatives 106 including bar code 110 are transported (by conveyor or manually) to a plate/negative exposing chamber. An exposing frame of the station 102 lowers the exposed negative 106 to the plate/negative exposure platen. Bar code reader 112 of the exposing station 102 scans the exposed negative 106 to determine the bar code 110 thereon. In general, it is assumed that the bar code 110 is a reverse image consistent with the remainder of the image of the exposed negative 106 so that the bar code data on the negative requires a bar code reader which reads negative input or reverse image input. The bar code information read by the reader 112 is then transmitted to the controller 118 by a bar code controller resident within the reader 112 and via buffer 121.

Next, the bar code information is correlated to the imposition file 1120 by the controller 118 to determine the number of plates to be produced for the next run of the multi-cylinder press 142. If no data is found, a no data code is transmitted to the exposing station 102 and the PLC 122 alerts the operator to input a value manually or a default value can be preset in the exposing station 102. If the bar code data is found and corresponds to an imposition file, the value, i.e., the number of plates to be produced as specified by the imposition file, is transmitted from the controller 118 to the exposing station 102 and the values are stored in the counter memory 124 of PLC 122. Optionally, the controller 118 may be updated as plates are completed by the exposing station 102 so that the controller is aware of the status of the exposing cycles at any instant in time.

Figure 5B:
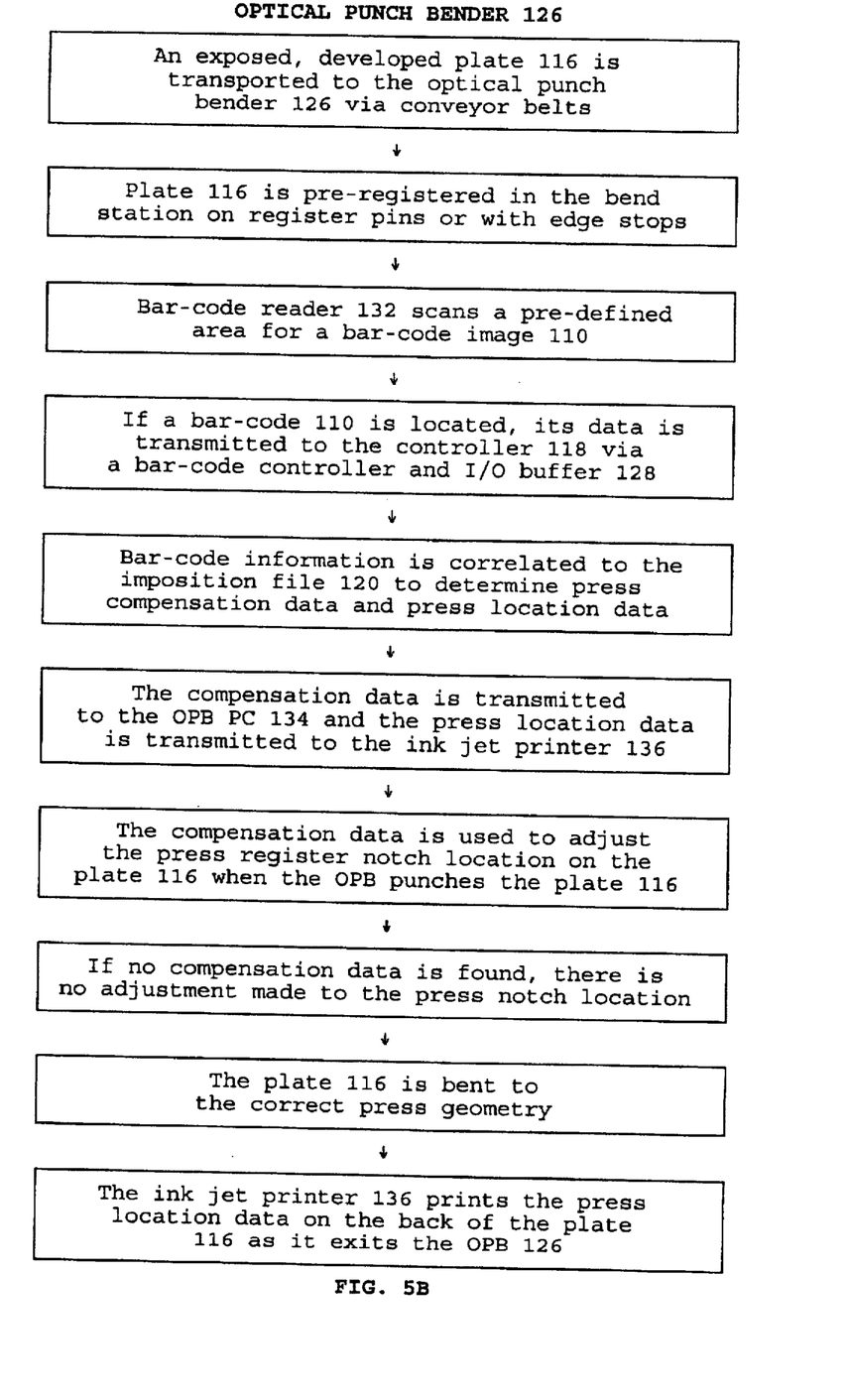

FIG. 5B illustrates the steps of the optical punch bender 126. Initially, an exposed developed plate 116 is transported to the optical punch bender 126 via conveyor belts (not shown) or via manual transfer. Plate 116 is preregistered in the bend station of the OPB 126 on register pins or with edge stops. Bar code reader 122 then scans a predefined area of the preregistered plate 116 for a bar code image 110. If the bar code image is located, its data embodied within the image is transmitted to the controller 118 via a bar code controller and I/O buffer 128. The bar code information is correlated to the imposition files 120 to determine the press compensation data and the press location data. The compensation data is transmitted to the OPB PC 134 and the press location data is transmitted to the ink jet printer 136. The compensation data is used to adjust the press register notch location on the plate 116 when the optical punch bender punches the plate 116. If no compensation is found, there is no additional adjustment made to the press notch location. Finally, the plate is bent to the correct press geometry. The ink jet printer 136 prints the press location data on the back of the plate 116 as it exits the optical punch bender 126.

Figure 5C:
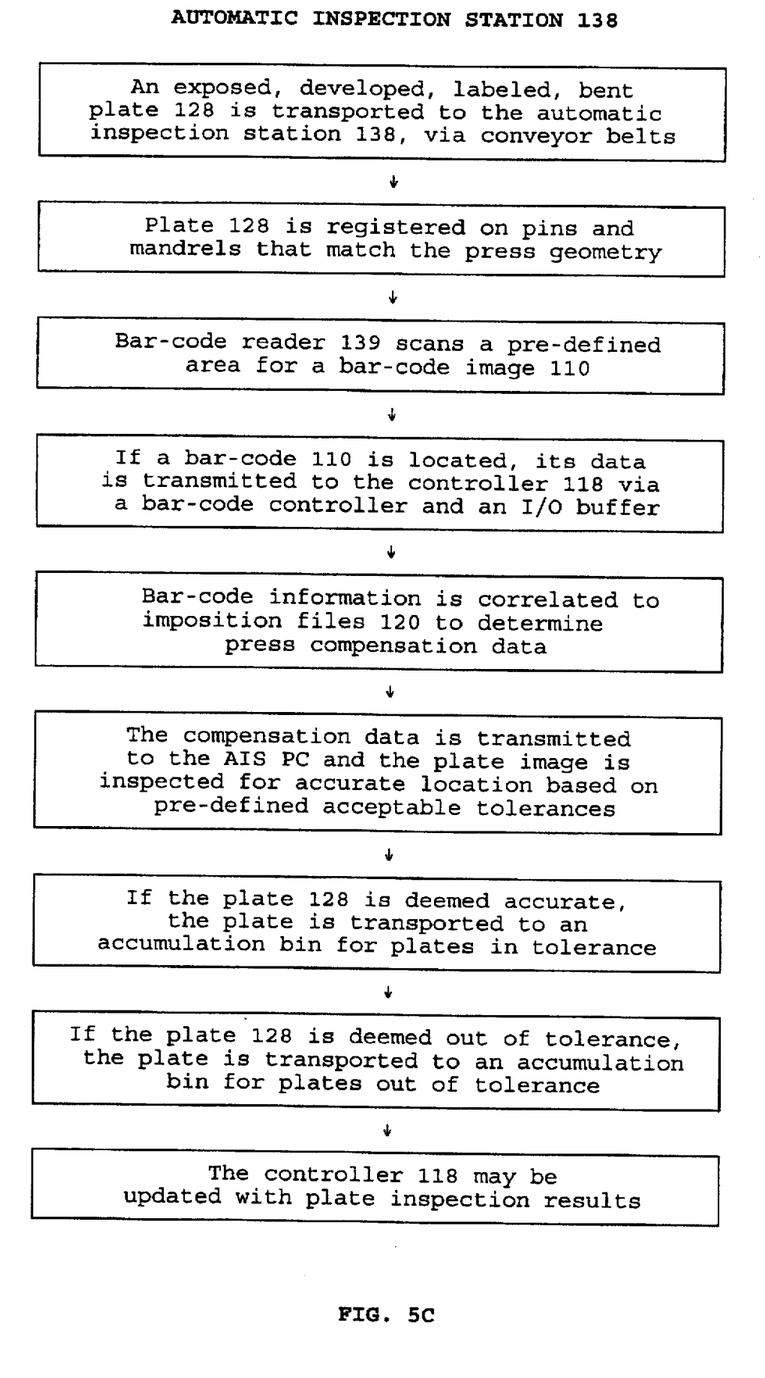

FIG. 5C illustrates the steps of the automatic inspection station 138. Initially, an exposed, developed, labeled, bent plate 128 is transported to the automatic inspection station 138 manually or via conveyor belts. Plate 128 is registered on pins and mandrels that match the press geometry. Bar code reader 139 scans a predefined area for a bar code image 110. If a bar code 110 is located, its data is transmitted to the controller 118 via a bar code controller and an I/O buffer. Bar code information is correlated to the imposition files 120 to determine press compensation data. The compensation data is transmitted to the AIS PC and the plate image is inspected for accurate location based on predefined acceptable tolerances. If the plate 128 is deemed accurate after inspection, the plate is transferred or transported to an accumulation bin for plates which are in tolerance. Alternatively, if the plate 128 is deemed out of tolerance, the plate is transferred or transported to an accumulation bin for plates out of tolerance. The controller 118 may be updated with plate inspection results. Alternatively, the plates which are within tolerance may be transported directly to the multi-cylinder press 142.

Figure 6:
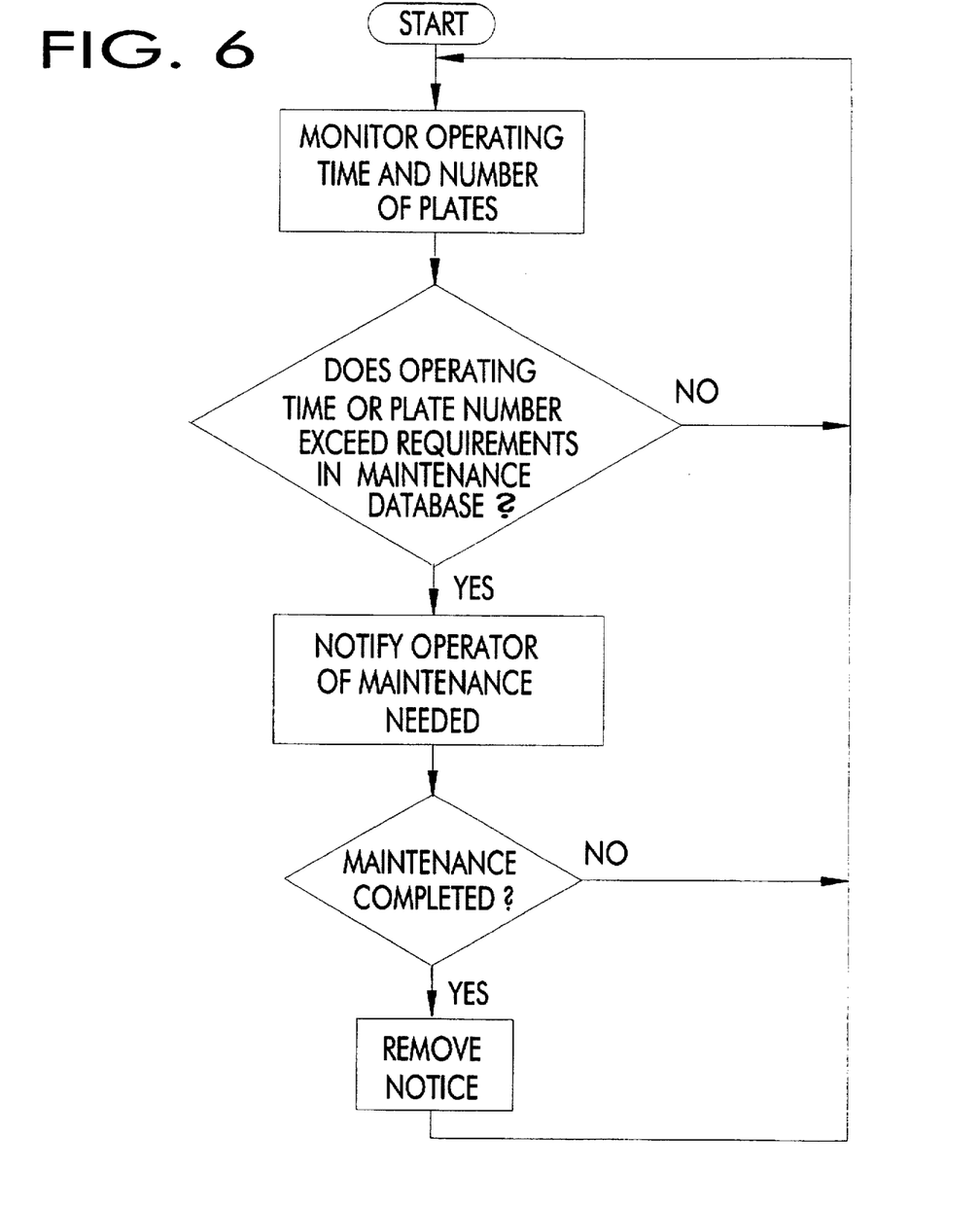
FIG. 6 is flow chart illustrating the operation of the auto-maintenance software of the invention.

FIG. 6 illustrates a flow chart of optional auto-maintenance software which may be resident in any of the stations, which may be resident in the controller 118 for controlling maintenance for any and all of the stations, or may be resident in both. For illustration, FIG. 6 is an example of a preferred embodiment for software which would be resident in the optical punch bender 126 for monitoring maintenance of the bender. The software may be part of the main software package of the controller 118 and will include an external text file or database with the maintenance requirements. The software analyzes both time of operation of the OPB and number of plates processed by the OPB 126 to determine when the appropriate maintenance is required. The software will require confirmation via a keyboard or other input indicating that the maintenance has been accomplished. Referring particularly to FIG. 6, at the first step the software monitors the operating time and number of plates of the optical punch bender 126. The actual time of operation or the number of plates made is compared in the next step to the maintenance requirements in the data base. If the operating time or number is below the maintenance requirements, the software returns to the initial step. Otherwise, it proceeds to notify the operator of the maintenance needed. After the operator indicates that the maintenance has been completed, then the notice of maintenance needed is removed and the program resets and returns to the initial step.

In view of the above, it will be seen that the several objects of the invention are achieved and other advantageous results attained.

As various changes could be made in the above products and methods without departing from the scope of the invention, it is intended that all matter contained in the above description and shown in the accompanying drawings shall be interpreted as illustrative and not in a limiting sense.

What is claimed is:

1. A system for generating from unimaged plates a plurality of exposed lithographic plates to be provided to a press for use in printing, the system for use with a film exposer for exposing a negative which includes an identifying code identifying the negative, said system comprising:

an exposing station having a first reader for reading the identifying code and having an exposer for exposing a number of unimaged plates to generate an image thereon from the exposed negative, the number of exposed plates corresponding to the identifying code read by the reader;

a bending station having a second reader for reading the identifying code on the exposed plates, and having an optical punch bender for bending the exposed plates in accordance with information corresponding to the identifying code; and an inspection station having a third reader for reading the identifying code on the bent plates and having an inspection unit for inspecting the bent plates to determine whether a particular bent plate has parameters which correspond to parameters defined by the identifying code of the particular bent plate whereby inspected plates which pass inspection and which have labels thereon are provided to the press for use in printing.

2. The system of claim 1 comprising a controller connected to the exposing station, the bending station and the inspection station, said controller having a memory including imposition files corresponding to the identifying code and defining the number of exposed plates needed for each negative, defining the label information for each exposed plate and defining bending parameters for each plate.

3. The system of claim 2 wherein the exposing station includes a counter for counting the number of exposed plates wherein the exposing station continues to generate exposed plates until the number of plates counted by the counter equals the number of plates defined by the imposition file memory.

4. The system of claim 3 further comprising automaintenance software in the controller for monitoring operation of one or more of the system stations and providing a notification to an operator when use of the monitored station exceeds certain requirements.

5. The system of claim 1 wherein the identifying code on the negative is a bar code and wherein the readers are each bar code readers.

6. The system of claim 5 wherein the bending station includes a printer for printing a label on a particular exposed plate, which information corresponds to the identifying code on the particular exposed plate whereby the plates provided to the press are labeled.

7. The system of claim 1 wherein the bending station includes a printer for printing a label on a particular exposed plate, which information corresponds to the identifying code on the particular exposed plate whereby the plates provided to the press are labeled.

8. The system of claim 1 further comprising automaintenance software monitoring operation of one or more of the system stations and providing a notification to an operator when use of the monitored station exceeds certain requirements.

9. In a system for generating from unexposed plates a plurality of exposed lithographic plates to be provided to a press for use in printing, the system including:

a film exposer for exposing a negative which includes an identifying code identifying the negative;

an exposing station for generating exposed plates;

a bending station having an optical punch bender for bending the exposed plates; and an inspection station having an inspection unit for inspecting the bent plates to determine whether a particular bent plate has parameters which correspond to predefined parameters; the improvement comprising:

said exposing station having a reader for reading the identifying code and having an exposer for exposing a number of unexposed plates to generate an image thereon from the exposed negative, the number of exposed plates corresponding to the identifying code read by the reader whereby inspected plates which pass inspection and have labels thereon are provided to the press for use in printing.

10. The system of claim 9 further comprising automaintenance software monitoring operation of one or more of the system stations and providing a notification to an operator when use of the monitored station exceeds certain requirements.

11. The system of claim 9 comprising a controller connected to the exposing station, the bending station and the inspection station, said controller having a memory including imposition files corresponding to the identifying code and defining the number of exposed plates needed for each negative, defining the label information for each exposed plate and defining bending parameters for each plate.

12. The system of claim 9 wherein the exposing station includes a counter for counting the number of exposed plates wherein the exposing station continues to generate exposed plates until the number of plates counted by the counter equals the number of plates defined by the imposition file memory.

13. In a system for generating from exposed plates a plurality of exposed lithographic plates to be provided to a press for use in printing, the system including:

a film exposer for exposing a negative which includes an identifying code identifying the negative;

an exposing station having an exposer for exposing a number of unexposed plates to generate an image thereon from the exposed negative;

a bending station for generating bent plates from the exposed plates; and an inspection station having an inspection unit for inspecting the bent plates to determine whether a particular bent plate has parameters which correspond to predefined parameters; the improvement comprising:

said bending station having a reader for reading the identifying code on the exposed plates, and having an optical punch bender for bending the exposed plates in accordance with information corresponding to the identifying code, and which information corresponds to the identifying code on the particular exposed plate whereby inspected plates which pass inspection are provided to the press for use in printing.

14. The system of claim 13 further comprising automaintenance software monitoring operation of one or more of the system stations and providing a notification to an operator when use of the monitored station exceeds certain requirements.

15. The system of claim 13 comprising a controller connected to the exposing station, the bending station and the inspection station, said controller having a memory including imposition files corresponding to the identifying code and defining the number of exposed plates needed for each negative, defining the label information for each exposed plate and defining bending parameters for each plate.

16. The system of claim 13 wherein the bending station includes a printer for printing a label on a particular exposed plate, which information corresponds to the identifying code on the particular exposed plate whereby the plates provided to the press are labeled.

17. In a system for generating from unimaged plates a plurality of exposed lithographic plates to be provided to a press for use in printing, the system including:

a film exposer for exposing a negative which includes an identifying code identifying the negative;

an exposing station having a first reader for reading the identifying code and having an exposer for exposing a number of unimaged plates to generate an image thereon from the exposed negative, the number exposed plates being a function of the identifying code read by the reader;

a bending station having a second reader for reading the identifying code on the exposed plates, having an optical punch bender for bending the exposed plates in accordance with information corresponding to the identifying code; the improvement comprising:

an inspection station having a reader for reading the identifying code on the bent plates and having an inspection unit for inspecting the bent plates to determine whether a particular bent plate has parameters which correspond to parameters defined by the identifying code of the particular plate whereby inspected plates which pass inspection and have labels thereon are provided to the press for use in printing.

18. The system of claim 17 further comprising automaintenance software monitoring operation of one or more of the system stations and providing a notification to an operator when use of the monitored station exceeds certain requirements.

19. The system of claim 17 comprising a controller connected to the exposing station, the bending station and the inspection station, said controller having a memory including imposition files corresponding to the identifying code and defining the number of exposed plates needed for each negative, defining the label information for each exposed plate and defining bending parameters for each plate.

* * * * *